(12) United States Patent
Chen et al.

(10) Patent No.: US 8,846,295 B2
(45) Date of Patent: Sep. 30, 2014

(54) PHOTORESIST COMPOSITION CONTAINING A PROTECTED HYDROXYL GROUP FOR NEGATIVE DEVELOPMENT AND PATTERN FORMING METHOD USING THEREOF

(75) Inventors: Kuang-Jung Chen, Poughkeepsie, NY (US); Wu-Song Huang, Brewster, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 13/457,735

(22) Filed: Apr. 27, 2012

(65) Prior Publication Data

US 2013/0288178 A1 Oct. 31, 2013

(51) Int. Cl.
*G03F 7/038* (2006.01)
*G03F 7/021* (2006.01)

(52) U.S. Cl.
CPC .............. *G03F 7/0382* (2013.01); *G03F 7/021* (2013.01); *Y10S 430/111* (2013.01)
USPC .......................... 430/270.1; 430/170; 430/910

(58) Field of Classification Search
CPC ................................ G03F 7/0382; G03F 7/021
USPC ........................................ 430/270.1, 910, 170
See application file for complete search history.

(56) References Cited

U.S. PATENT DOCUMENTS

| | | | |
|---|---|---|---|
| 4,491,628 A | 1/1985 | Ito et al. | |
| 5,258,257 A | 11/1993 | Sinta et al. | |
| 5,492,793 A | 2/1996 | Breyta et al. | |
| 5,545,509 A | 8/1996 | Cameron et al. | |
| 6,114,082 A * | 9/2000 | Hakey et al. | 430/270.1 |
| 6,232,417 B1 | 5/2001 | Rhodes et al. | |
| 6,309,797 B1 | 10/2001 | Grinevich et al. | |
| 6,372,412 B1 * | 4/2002 | Hakey et al. | 430/325 |
| 6,403,281 B1 | 6/2002 | Lee et al. | |
| 6,645,698 B1 | 11/2003 | Thackeray et al. | |
| 6,818,376 B2 | 11/2004 | Lee et al. | |
| 7,081,326 B2 | 7/2006 | Li et al. | |
| 7,217,496 B2 | 5/2007 | Khojasteh et al. | |
| 7,282,549 B2 | 10/2007 | Narita et al. | |
| 7,612,146 B2 | 11/2009 | Rhodes et al. | |
| 7,851,140 B2 | 12/2010 | Tsubaki | |
| 8,017,303 B2 | 9/2011 | Goldfarb et al. | |
| 2008/0187860 A1 | 8/2008 | Tsubaki et al. | |
| 2008/0261150 A1 | 10/2008 | Tsubaki et al. | |
| 2008/0318171 A1 | 12/2008 | Tsubaki | |
| 2009/0011366 A1 | 1/2009 | Tsubaki et al. | |
| 2009/0042147 A1 | 2/2009 | Tsubaki | |
| 2009/0176174 A1 | 7/2009 | Chen et al. | |
| 2009/0286182 A1 | 11/2009 | Harada et al. | |
| 2010/0040971 A1 | 2/2010 | Tarutani et al. | |
| 2010/0040972 A1 | 2/2010 | Tarutani et al. | |
| 2010/0239984 A1 | 9/2010 | Tsubaki | |
| 2010/0323305 A1 | 12/2010 | Tsubaki et al. | |
| 2010/0330507 A1 | 12/2010 | Tsubaki et al. | |
| 2011/0020755 A1 | 1/2011 | Tsubaki | |
| 2011/0177455 A1 | 7/2011 | Harada et al. | |
| 2011/0177462 A1 | 7/2011 | Hatakeyama et al. | |
| 2011/0236826 A1 | 9/2011 | Hatakeyama et al. | |
| 2011/0236831 A1 | 9/2011 | Hasegawa et al. | |
| 2012/0009527 A1 | 1/2012 | Hatakeyama et al. | |
| 2012/0009529 A1 | 1/2012 | Hatakeyama | |

OTHER PUBLICATIONS

U.S. Appl. No. 12/946,232, filed Nov. 15, 2010, Kuang-Jung Chen, et al.

* cited by examiner

*Primary Examiner* — John Chu
(74) *Attorney, Agent, or Firm* — Yuanmin Cai; L. Jeffrey Kelly

(57) ABSTRACT

The present invention relates to a photoresist composition capable of negative development and a pattern forming method using the photoresist composition. The photoresist composition includes an imaging polymer, a crosslinking agent and a radiation sensitive acid generator. The imaging polymer includes a monomeric unit having an acid-labile moiety-substituted hydroxyl group. The patterning forming method utilizes an organic solvent developer to selectively remove an unexposed region of a photoresist layer of the photoresist composition to form a patterned structure in the photoresist layer. The photoresist composition and the pattern forming method are especially useful for forming material patterns on a semiconductor substrate using 193 nm (ArF) lithography.

18 Claims, No Drawings

PHOTORESIST COMPOSITION CONTAINING A PROTECTED HYDROXYL GROUP FOR NEGATIVE DEVELOPMENT AND PATTERN FORMING METHOD USING THEREOF

FIELD OF THE INVENTION

This invention relates generally to photolithography, and more particularly to a photoresist composition capable of negative development using an organic solvent as the developer. This invention is also directed to a pattern forming method of using such a photoresist composition.

BACKGROUND OF THE INVENTION

Photolithography is widely used in semiconductor industry to fabricate electronic devices. Photolithography is a process which uses light to transfer a geometric pattern from a photomask to a substrate such as a silicon wafer. In a photolithography process, a photoresist layer is first formed on the substrate. The substrate is baked to remove any solvent remained in the photoresist layer. The photoresist is then exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution, usually an aqueous base solution, to form a pattern in the photoresist layer. The patterned photoresist can then be used as a mask for subsequent fabrication processes on the substrate, such as deposition, etching, or ion implantation processes.

Two types of photoresist have been used in photolithography: positive resist and negative resist. A positive resist is initially insoluble in the developer solution. After exposure, the exposed region of the resist becomes soluble in the developer solution and is then selectively removed by the developer solution during the subsequent development step. The unexposed region of the positive resist remains on the substrate to form a pattern in the photoresist layer. The selective removal of the exposed region of a photoresist is thus called "positive development".

A negative resist behaves in the opposite manner. The negative resist is initially soluble in the developer solution. Exposure to radiation typically initiates a crosslinking reaction which causes the exposed region of the negative resist to become insoluble in the developer solution. During the subsequent development step, the unexposed region of the negative resist is selectively removed by the developer solution, leaving the exposed region on the substrate to form a pattern. Contrary to the "positive development", a "negative development" refers to a process that selectively removes the unexposed region of a photoresist.

Most commercial photoresists for 193 nm photolithography are positive resists. However, as semiconductor ground rule continues to shrink, it has become ever more challenging to print small features, especially spaces such as trenches and vias of small dimensions using traditional positive resist with aqueous base developer due to the poor optical image contrast of the dark field masks used to create the trenches and vias. Therefore, there is a need for a photoresist composition and a pattern forming method that can print small features, particularly spaces of small dimensions.

SUMMARY OF THE INVENTION

The present invention provides a photoresist composition which is capable of negative development using an organic solvent developer. This invention also provides a pattern forming method which is capable of printing trenches and vias of small dimensions.

In one aspect, the present invention relates to a photoresist composition capable of negative development. The photoresist composition includes an imaging polymer, a crosslinking agent and a radiation sensitive acid generator. The imaging polymer includes a monomeric unit having an acid-labile moiety-substituted hydroxyl group.

In another aspect, the present invention relates to a method of forming a patterned material structure on a substrate. The method includes the steps of: providing a substrate with a layer of the material; applying a photoresist composition to the substrate to form a photoresist layer over the material layer, the photoresist composition comprising an imaging polymer, a crosslinking agent and a radiation sensitive acid generator, the imaging polymer comprising a monomeric unit having an acid labile moiety-substituted hydroxyl group; patternwise exposing the substrate to radiation whereby acid is generated by the radiation sensitive acid generator; and contacting the photoresist layer with a developer comprising an organic solvent whereby an unexposed region of the photoresist layer is selectively removed by the developer to form a patterned structure in the photoresist layer.

The developer in the method above may be selected from the group consisting of an ether, a glycol ether, an aromatic hydrocarbon, a ketone, an ester and a combination of two or more of the foregoing solvents.

The method above may further include at least one of the following steps: baking the substrate at a temperature from about 70° C. to about 150° C., after the patternwise exposing step and before the contacting step; rinsing the photoresist layer with a second organic solvent after the contacting step; and transferring the patterned structure to the material layer. The second organic solvent may be selected from the group consisting of 1-butanol, methanol, ethanol, 1-propanol, ethylene glycol, 1,2-butanediol, 1,3-butanediol, 1,4-butanediol, 1,2-propanediol, 1-methyl-2-butanol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, and a combination of two or more of the foregoing solvents.

The acid-labile moiety of the imaging polymer may be selected from the group consisting of a tertiary alkyl carbonate, a tertiary alkyl ether, an acetal, a ketal and an orthoester. Preferably, the acid-labile moiety is an acetal or a ketal group. In addition, the monomeric unit of the imaging polymer preferably contains an alicyclic structure. The imaging polymer may further include a second monomeric unit having a lactone group.

The crosslinking agent of the photoresist composition is preferably a glycoluril compound.

The radiation sensitive acid generator of the photoresist composition may include at least one of an onium salt, a succinimide derivative, a diazo compound, and a nitrobenzyl compound.

The photoresist composition may further include at least one of a solvent, a quencher, and a surfactant. The solvent is preferably at least one of an ether, a glycol ether, an aromatic hydrocarbon, a ketone, and an ester. The photoresist composition may contain about 1 to about 30 wt. % of the imaging polymer; about 1 to about 30 wt. % of the crosslinking agent, based on the total weight of the imaging polymer; about 0.5 to about 30 wt. % of the radiation sensitive acid generator, based on the total weight of the imaging polymer; and about 70 to about 99 wt. % of the solvent.

DETAILED DESCRIPTION OF PREFERRED EMBODIMENTS

The terms "a" and "an" herein do not denote a limitation of quantity, but rather denote the presence of at least one of the referenced item.

"Optional" or "optionally" means that the subsequently described event or circumstance may or may not occur, and the description includes instances where the subsequently described event or circumstance occurs and instances where it does not.

When an element, such as a layer, is referred to as being "on" or "over" another element, it can be directly on the other element or intervening elements may also be present. In contrast, when an element is referred to as being "directly on" or "directly over" another element, there are no intervening elements present.

As discussed above, most commercial photoresists for 193 nm photolithography are positive resists. As the feature size continues to shrink, it has become more difficult to print spaces such as trenches and vias of small dimensions using traditional positive resists. To create trenches and vias with positive resists, dark field masks need to be used. However, the optical image contrast of the dark field masks diminishes as the feature sizes of the trenches and vias decrease.

Recently, a pattern forming method using traditional positive resists for negative development has gained much attention. Like traditional approaches using positive resists, this method relies on the de-protection mechanism to create dissolution contrast between exposed and unexposed regions in the photoresist layer. However, instead of aqueous alkaline developer, an organic solvent is then used in this method as the developer for negative development which selectively removes the unexposed regions of the photoresist layer. Since the resist in the exposed regions often has some solubility in the organic solvent developer, this method may suffer from thickness loss after the development step.

The present invention provides a photoresist composition for negative development which can be used to print trenches and vias of small dimensions. The composition in the present invention combines the deprotection mechanism with the crosslinking mechanism to achieve a high dissolution contrast between the exposed and unexposed regions and to prevent thickness loss of the photoresist layer during the development step. This is accomplished by including an imaging polymer with an acid labile moiety-substituted hydroxyl group and a crosslinkable agent in the photoresist composition.

In one embodiment, the photoresist composition of the present invention includes an imaging polymer, a crosslinking agent and a radiation sensitive acid generator. The imaging polymer includes a monomeric unit having an acid-labile moiety-substituted hydroxyl group. The monomeric unit is derived from monomers having a polymerizable moiety. Examples of the polymerizable moiety may include:

where $R_1$ represents hydrogen, a linear or branched alkyl group of 1 to 20 carbons, a semi- or perfluorinated linear or branched alkyl group of 1 to 20 carbons, or CN; and

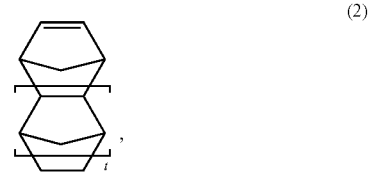

where t is an integer from 0 to 3.

The acid labile moiety in the monomeric unit may be a tertiary alkyl carbonate, a tertiary alkyl ether, an acetal, a ketal or an orthoester. Preferably, the acid-labile moiety is an acetal or a ketal group. In addition, the monomeric unit of the imaging polymer preferably contains an alicyclic structure. More preferably, the alicyclic structure is an adamantane ring. In one preferred embodiment, the hydroxyl group of the monomer unit is protected with the acid-labile moiety after the imaging polymer is formed.

Examples of monomers which the monomeric unit can derive from may include, but are not limited to:

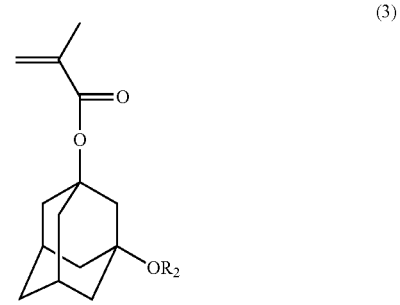

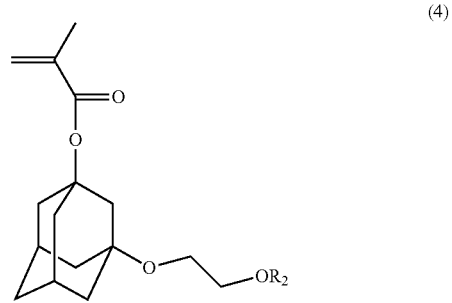

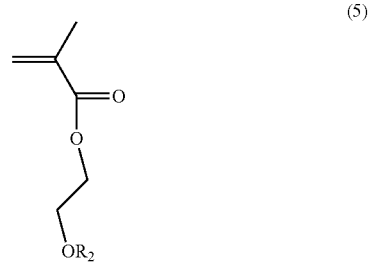

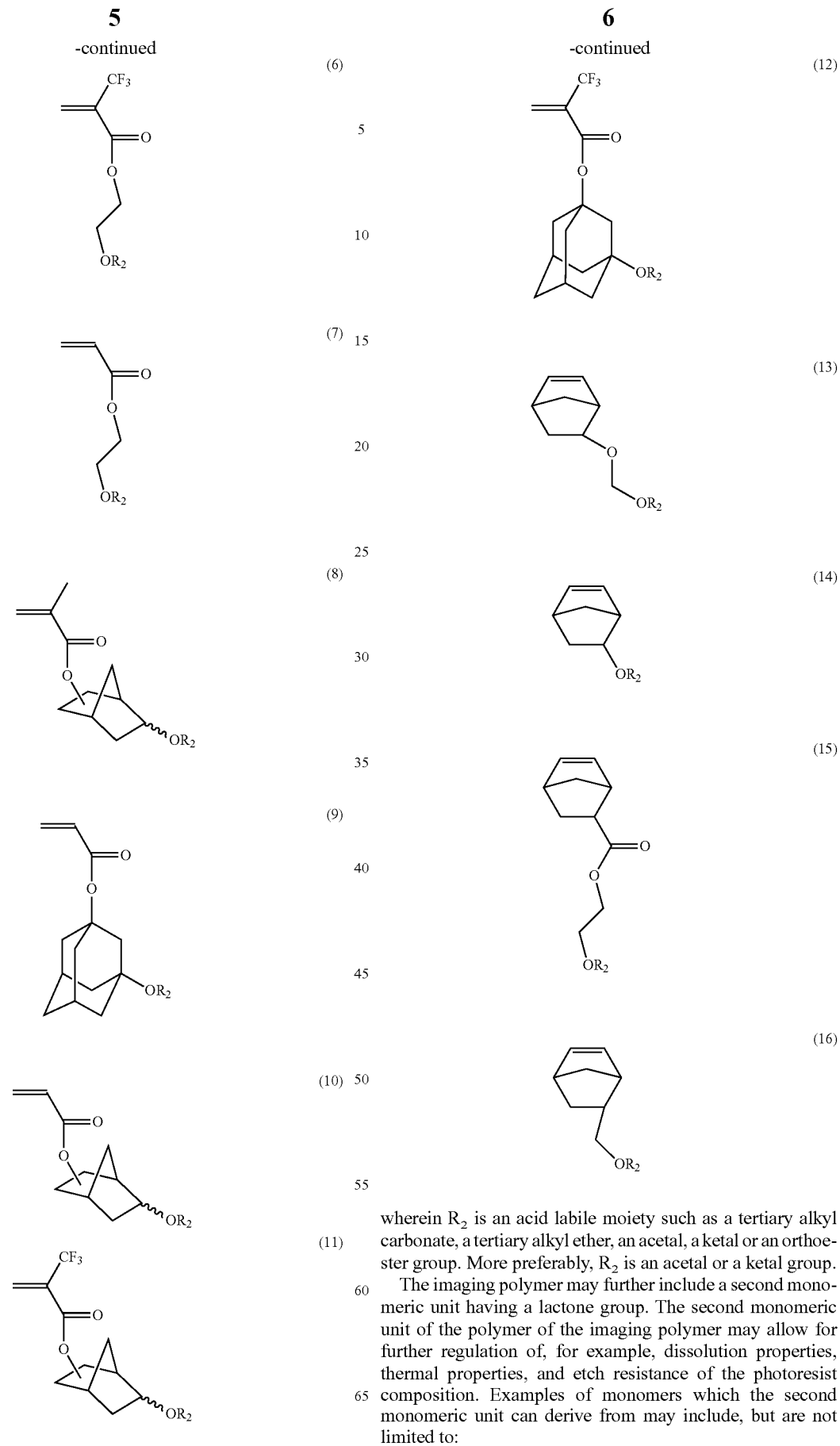

wherein $R_2$ is an acid labile moiety such as a tertiary alkyl carbonate, a tertiary alkyl ether, an acetal, a ketal or an orthoester group. More preferably, $R_2$ is an acetal or a ketal group.

The imaging polymer may further include a second monomeric unit having a lactone group. The second monomeric unit of the polymer of the imaging polymer may allow for further regulation of, for example, dissolution properties, thermal properties, and etch resistance of the photoresist composition. Examples of monomers which the second monomeric unit can derive from may include, but are not limited to:

(17) 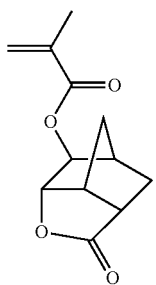

(18) 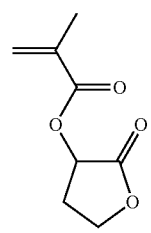

(19) 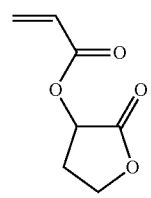

(20) 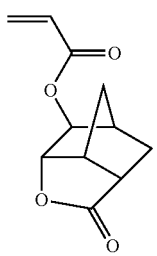

(21) 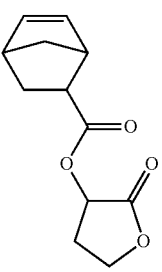

(22) 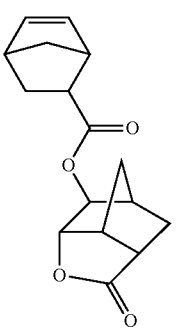

(23) 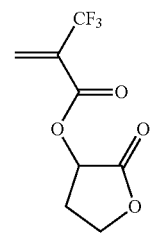

(24) 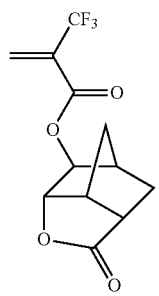

The photoresist composition also includes a crosslinking agent. When a photoresist layer formed from the photoresist composition is exposed, the acid-labile moiety-substituted hydroxyl group may be de-protected in the exposed areas. The de-protection of the acid-labile moiety-substituted hydroxyl group creates a solubility difference in an organic developer between the exposed and unexposed regions of the photoresist layer. In addition, in the exposed regions, the crosslinking agent can react with the de-protected hydroxyl group of the imaging polymer in a manner which is catalyzed by acid and/or by heating to interlink or crosslink the imaging polymer chains. The crosslinking of the imaging polymer chains further reduces the solubility of the exposed regions in the organic developer and thus enhances the solubility difference in the organic developer between the exposed and unexposed regions of the photoresist layer. The crosslinking of the imaging polymer chains also reduces or eliminates the thickness loss of the exposed regions.

Generally, the crosslinking agent of the photoresist composition of the present invention is any suitable crosslinking agent known in the negative photoresist art which is compatible with the other selected components of the photoresist composition. The crosslinking agent typically acts to crosslink the imaging polymer in the presence of a generated acid. Typical crosslinking agents are glycoluril compounds such as tetramethoxymethyl glycoluril, methylpropyltetramethoxymethyl glycoluril, and methylphenyltetramethoxymethyl glycoluril, available under the POWDERLINK® trademark from Cytec Industries. Other possible crosslinking agents include: 2,6-bis(hydroxymethyl)-p-cresol compounds such as those disclosed in Japanese Laid-Open Patent Application (Kokai) No. 1-293339, etherified amino resins, for example, methylated or butylated melamine resins (N-methoxymethyl- or N-butoxymethyl-melamine respectively), and methylated/butylated glycolurils, for example as disclosed in Canadian Patent No. 1 204 547. Other crosslinking agents such as bis-epoxies or bis-phenols (e.g., bisphenol-A) may also be used. Combinations of two or more crosslinking agents may be preferred in some embodiments.

Some particular examples of crosslinking agents suitable for use in the photoresist composition according to the present invention include, but are not limited to:

(25) 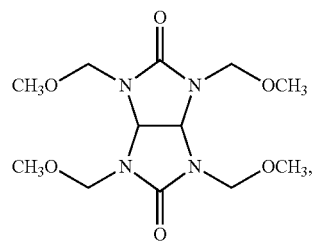
(31) 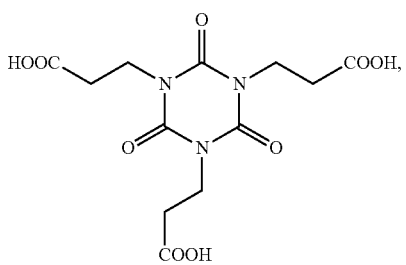
(26) 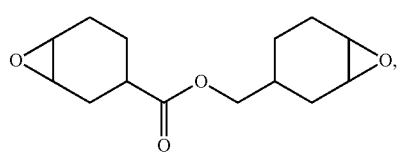
(32) 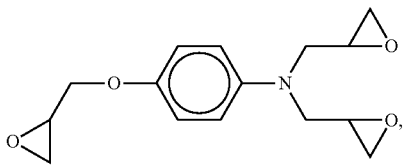
(27) 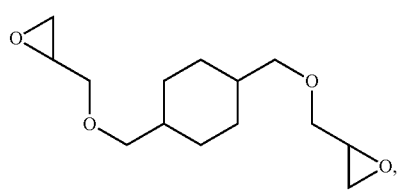
(33) 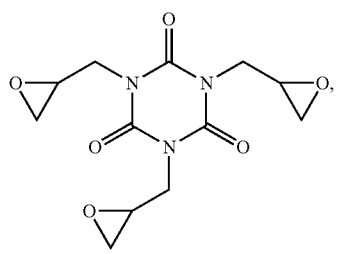
(28) 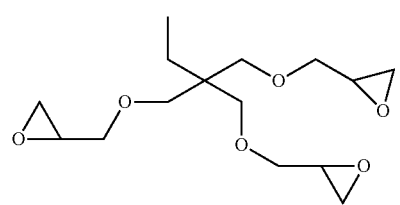
(34) 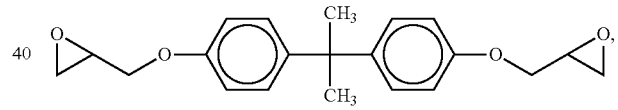
(29) 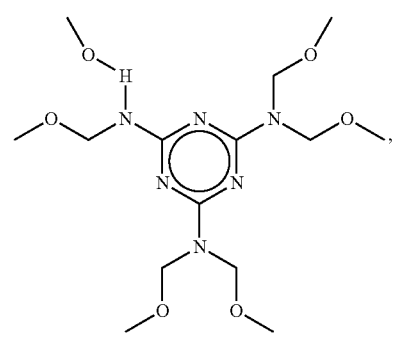
(35) 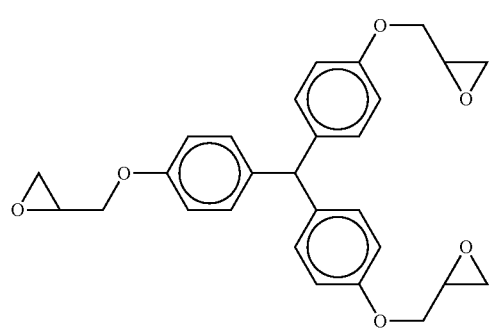
(30)
(36) 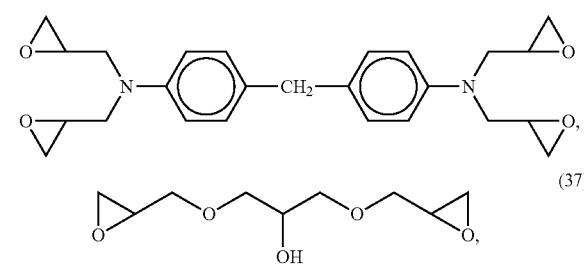
(37)

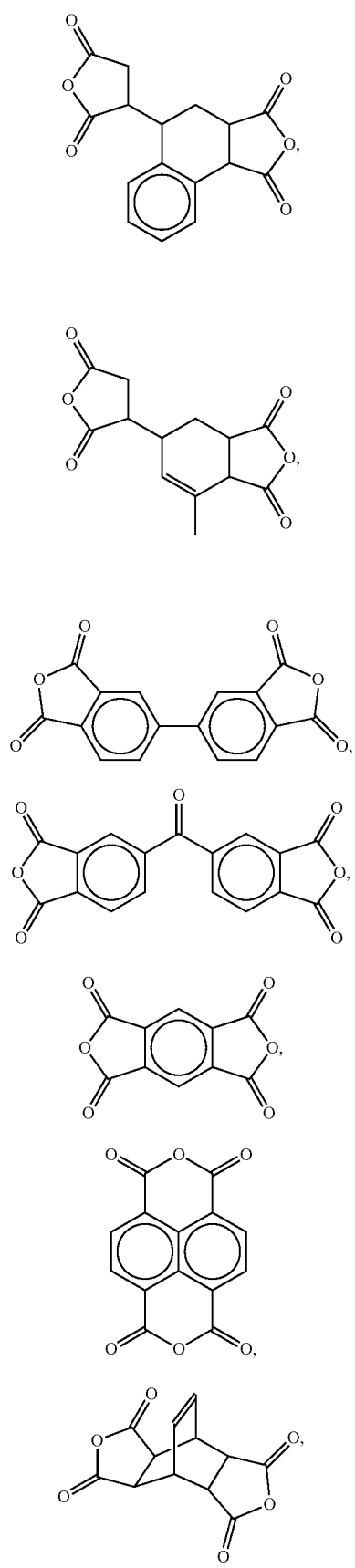

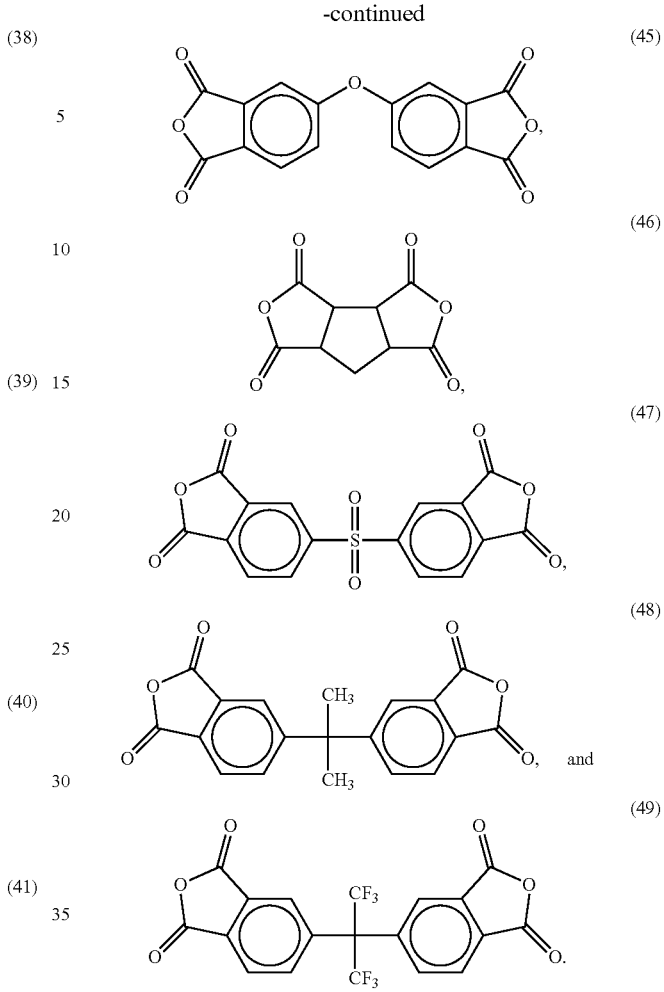

The photoresist composition of the present invention also includes a third component—a radiation sensitive acid generator. The radiation sensitive acid generator, also known as photoacid generator (PAG), is a compound that generates an acid upon exposure to radiation. The PAG of the present invention may be one of an onium salt, a succinimide derivative, a diazo compound, a nitrobenzyl compound, and the like. To minimize acid diffusion for high resolution capability, the PAGs may be such that they generate bulky acids upon exposure to radiation. Such bulky acids may include at least 4 carbon atoms.

A preferred PAG that may be employed in the present invention is an onium salt, such as an iodonium salt or a sulfonium salt, and/or a succinimide derivative. In various exemplary embodiments of the present invention, the preferred PAG may include 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl)iodonium perfluorobutane sulfonate, di(t-butylphenyl)iodonium perfluorohexane sulfonate, di(t-butylphenyl)iodonium perfluoroethylcyclohexane sulfonate, di(t-butylphenyl)iodonium camphoresulfonate, and perfluorobutylsulfonyloxybicylo[2.2.1]-hept-5-ene-2,3-dicarboximide. Any of these PAGs may be used singly or in a mixture of two or more. Both fluorinated and fluorine-free PAGs can be used in the present invention.

The specific PAG selected will depend on the irradiation being used for patterning the photoresist. PAGs are currently available for a variety of different wavelengths of light from the visible range to the extreme UV range. Preferably, the PAG is one suitable for use in 193 nm (ArF) lithography.

The photoresist composition of the present invention may further include a solvent, and other performance enhancing additives, for example, a quencher and a surfactant. Solvents well known to those skilled in the art may be employed in the photoresist composition of various exemplary embodiments of the present invention. Such solvents may be used to dissolve the imaging polymer and other components of the photoresist composition. Illustrative examples of such solvents may include, but are not limited to: ethers, glycol ethers, aromatic hydrocarbons, ketones, esters and the like. A solvent system including a mixture of the aforementioned solvents is also contemplated. Suitable glycol ethers include: 2-methoxyethyl ether (diglyme), ethylene glycol monomethyl ether, propylene glycol monomethyl ether, propylene glycol monomethylether acetate (PGMEA) and the like. Suitable aromatic hydrocarbon solvents include: toluene, xylene, and benzene. Examples of ketones include: methylisobutylketone, 2-heptanone, cycloheptanone, and cyclohexanone. An example of an ether solvent is tetrahydrofuran, whereas ethyl lactate and ethoxy ethyl propionate are examples of ester solvents that may be employed in the present invention.

The quencher that may be used in the photoresist composition of the present invention may comprise a weak base that scavenges trace acids, while not having an excessive impact on the performance of the positive photoresist. Illustrative examples of quenchers that can be employed in the present invention include, but are not limited to: aliphatic amines, aromatic amines, carboxylates, hydroxides, or combinations thereof and the like.

The optional surfactants that can be employed in the photoresist compositions include any surfactant that is capable of improving the coating homogeneity of the chemically amplified photoresist composition of the present invention. Illustrative examples include: fluorine-containing surfactants such as 3M's FC-4430® and siloxane-containing surfactants such as Union Carbide's Silwet® series.

In addition to the above components, the photoresist composition may also include other components such as photosensitizers and/or other additives. If desired, combinations or mixtures of the components may be used (e.g., a photosensitizer and a base). The optional photosensitizer is preferably one containing chromophores that are capable of absorbing irradiation in 193 nm (ArF) lithography. Illustrative examples of such compounds include, but are not limited to: 9-anthracene methanol, coumarins, 9,10-bis(trimethoxysily ethynyl) anthracene and polymers containing these chromophores.

In various exemplary embodiments of the present invention, the photoresist composition of the invention may include: about 1 to about 30 wt. % of the imaging polymer, more preferably about 3 to about 15 wt. %; about 1 to about 30 wt. % of the crosslinking agent, based on the total weight of the imaging polymer, more preferably about 2 to about 20 wt. %; about 0.5 to about 30 wt. % of the radiation sensitive acid generator, based on the total weight of the imaging polymer, more preferably about 0.5 to about 15 wt. %; and a solvent, which may typically be present in amounts of about 70 to about 99 wt. % of the composition, more preferably about 85 to about 97 wt. %.

In various exemplary embodiments, the photoresist composition may further comprise a quencher, which may typically be present in amounts of about 0.1 to about 10.0 wt. % based on the total weight of the imaging polymer, and a surfactant, which may typically be present in amounts of about 0.001 to about 1.0 wt. %, based on the total weight of the imaging polymer. When a photosensitizer is employed, it is preferably present in amounts of about 0.001 to about 8 weight %, based on the total weight of the imaging polymer.

Note that the amounts given above are exemplary and that other amounts of each of the above components, which are typically employed in the photolithography industry, can also be employed herein.

The present invention also encompasses a method of using the photoresist composition described above to form patterned material features on a substrate. In one embodiment, such a method includes the steps of: providing a substrate with a layer of the material; applying a photoresist composition to the substrate to form a photoresist layer over the material layer, the photoresist composition comprising an imaging polymer, a crosslinking agent and a radiation sensitive acid generator, the imaging polymer comprising a monomeric unit having an acid labile moiety-substituted hydroxyl group; patternwise exposing the substrate to radiation whereby acid is generated by the radiation sensitive acid generator; and contacting the photoresist layer with a developer comprising an organic solvent whereby an unexposed region of the photoresist layer is selectively removed by the developer to form a patterned structure in the photoresist layer.

The substrate is suitably any substrate conventionally used in processes involving photoresists. For example, the substrate can be silicon, silicon oxide, aluminum-aluminum oxide, gallium arsenide, ceramic, quartz, copper or any combination thereof, including multilayers. The substrate can include one or more semiconductor layers or structures and can include active or operable portions of semiconductor devices.

The material layer may be a metal conductor layer, a ceramic insulator layer, a semiconductor layer or other material depending on the stage of the manufacture process and the desired material set for the end product. The photoresist compositions of the invention are especially useful for lithographic processes used in the manufacture of integrated circuits on semiconductor substrates. The photoresist compositions of the invention can be used in lithographic processes to create patterned material layer structures such as metal wiring lines, holes for contacts or vias, insulation sections (e.g., damascene trenches or shallow trench isolation), trenches for capacitor structures, ion implanted semiconductor structures for transistors, etc. as might be used in integrated circuit devices.

In some cases, a bottom antireflective coating and/or underlayer coating (e.g., a planarizing underlayer) may be applied between the photoresist layer and the material layer. In other cases, a top antireflective coating layer may be applied over the photoresist layer. The invention is not limited to the use of antireflective reflective coatings and/or underlayer materials, nor specific compositions of those coatings or materials.

The photoresist layer may be formed by virtually any standard means including spin coating. The photoresist layer may be baked (post applying bake (PAB)) to remove any solvent from the photoresist and improve the coherence of the photoresist layer. The preferred range of the PAB temperature for the photoresist layer is from about 70° C. to about 150° C., more preferably from about 90° C. to about 130° C. The preferred range of thickness of the first layer is from about 20 nm to about 400 nm, more preferably from about 30 nm to about 300 nm.

The photoresist layer is then patternwise exposed to the desired radiation. The radiation employed in the present invention can be visible light, ultraviolet (UV), extreme ultraviolet (EUV) and electron beam (E-beam). It is preferred that the imaging wavelength of the radiation is about 248 nm, 193 nm or 13 nm. It is more preferred that the imaging wavelength of the radiation is about 193 nm (ArF laser). The patternwise exposure is conducted through a mask which is placed over the photoresist layer.

After the desired patternwise exposure, the photoresist layer is typically baked (post exposure bake (PEB)) to further complete the acid-catalyzed reaction and to enhance the contrast of the exposed pattern. The preferred range of the PEB temperature is from about 70° C. to about 150° C., more preferably from about 90° C. to about 130° C. In some instances, it is possible to avoid the PEB step since for certain chemistries, such as acetal and ketal chemistries, deprotection of the resist polymer proceeds at room temperature. The post-exposure bake is preferably conducted for about 30 seconds to 5 minutes.

After PEB, if any, the photoresist layer with the desired pattern is obtained (developed) by contacting the photoresist layer with a developer comprising an organic solvent. Preferably, the developer is selected from the group consisting of ethers, glycol ethers, aromatic hydrocarbons, ketones, esters and a combination of two or more of the foregoing solvents. Suitable glycol ethers include: 2-methoxyethyl ether (diglyme), ethylene glycol monomethyl ether, propylene glycol monomethyl ether, propylene glycol monomethylether acetate (PGMEA) and the like. Suitable aromatic hydrocarbon solvents include: toluene, xylene, and benzene. Examples of ketones include: methylisobutylketone, 2-heptanone, cycloheptanone, and cyclohexanone. An example of an ether solvent is tetrahydrofuran, whereas ethyl lactate, n-butyl acetate and ethoxy ethyl propionate (EEP) are examples of ester solvents that may be employed in the present invention. More preferably, the developer is 2-heptanone, PGMEA, or EEP. The developer selectively dissolves the areas of the photoresist which were unexposed to the radiation. Hence, the development step in the present invention is a "negative development" step.

Optionally, the method of the present invention may further include a step of rinsing the photoresist layer with a second organic solvent after the development step.

After resist development, some residues may remain on the substrate due to its low solubility in developer. Rinse with the second organic solvent removes these residues and provides clean resist images. Preferably, the second organic solvent has a slightly higher polarity than the developer. Examples of such a second organic solvent may include, but are not limited to: 1-butanol, methanol, ethanol, 1-propanol, ethylene glycol, 1,2-butanediol, 1,3-butanediol, 1,4-butanediol, 1,2-propanediol, 1-methyl-2-butanol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, and a combination of two or more of the foregoing solvents.

The pattern from the photoresist layer may then be transferred to the exposed portions of underlying material layer of the substrate by etching with a suitable etchant using techniques known in the art; preferably the transfer is done by reactive ion etching or by wet etching. Once the desired pattern transfer has taken place, any remaining photoresist may be removed using conventional stripping techniques. Alternatively, the pattern may be transferred by ion implantation to form a pattern of ion implanted material.

Examples of general lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570. Other examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithography technique or device structure.

The invention is further described by the examples below. The invention is not limited to the specific details of the examples.

Monomer Structures

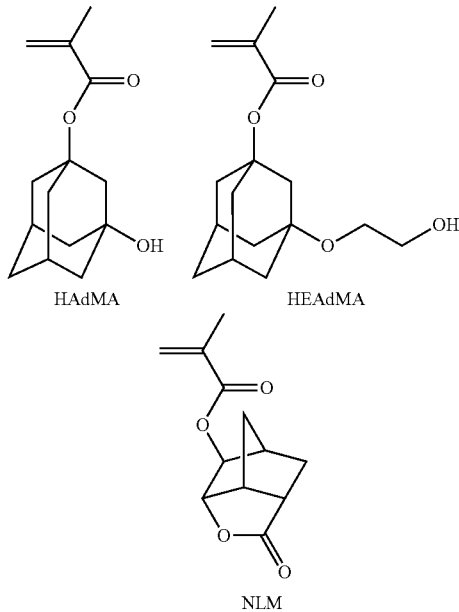

HAdMA   HEAdMA

NLM

Example 1

Synthesis of Acid Labile Groups Protected Polymer of 3-hydroxy-1-adamantyl methacrylate (Polymer A)

To a round bottom flask equipped with a condenser, a thermometer, an argon inlet and a magnetic stirrer bar, 3-hydroxy-1-adamantyl methacrylate (HAdMA) monomer (3.546 g, 0.015 mole), 2,2'-azobis(2-methylpropionitrile) (AIBN) (0.172 g, 7% of total moles of monomer), and ~15 g of tetrahydrofuran (THF) were added. The reaction mixture was stirred at room temperature and bubbled with Ar flow for 45 minutes prior to turning on the heating mantle. The reaction was carried out at 72° C. under Ar inert atmosphere overnight. Then the reaction solution was cooled to room temperature and precipitated in hexane. The precipitated polymer was filtered and washed with hexane. The collected solid was dried by vacuum oven at 40° C. overnight.

1.4 g of the above obtained polymer was dissolved in 18.9 g of PGMEA in a round bottom flask. To the polymer solution approximately 40 mg of p-toluenesulfonic acid was added. After the acid was dissolved, 1.7 g of 1-methoxycyclohexene, 1.1 g of 2-methoxypropene and 0.5 g of dihydropyrane were added to the solution. The reaction was carried out at room temperature for a few days until the solution was clear. The reaction was then quenched with 5 g of basic active aluminum oxide. The quenched solution was filtered through 0.2 µm filter into a glass bottle.

Example 2

Synthesis of Dihydropyrane Protected Copolymer of 3-(2-hydroxyethoxy)-1-adamantyl methacrylate and 5-methacryloyloxy-2,6-norbornanecarbo-gamma-lactone (Polymer B)

To a round bottom flask equipped with a condenser, a thermometer, an argon inlet and a magnetic stirrer bar, 3-(2-hydroxyethoxy)-1-adamantyl methacrylate (HEAdMA) monomer (4.44 g, 0.02 mole), 5-methacryloyloxy-2,6-norbornanecarbo-gamma-lactone (NLM) monomer (5.61 g, 0.02 mole), AIBN (0.328 g, 5% of total moles of monomers), and ~40 g of THF were added. The reaction mixture was stirred at room temperature and bubbled with Ar flow for 45 minutes prior to turning on the heating mantle. The reaction was carried out at 72° C. under Ar inert atmosphere overnight. Then the reaction solution was cooled to room temperature and precipitated in DI water. The precipitated polymer was filtered and washed with DI water. The collected solid was dried by vacuum oven at 65° C. overnight.

2 g of the above obtained polymer was dissolved in 18 g of PGMEA in a round bottom flask. To the polymer solution approximately 10 mg of p-toluenesulfonic acid was added. After the acid was dissolved, 1.5 g of dihydropyrane was added to the solution, and the reaction was carried out at room temperature overnight. The solution became clear. The reaction was then quenched with 3 g of basic active aluminum oxide. The quenched solution was filtered through 0.2 µm filter into a glass bottle.

Example 3

Synthesis of Dihydropyrane Protected Copolymer of 3-hydroxy-1-adamantyl methacrylate and 5-methacryloyloxy-2,6-norbornanecarbo-gamma-lactone (Polymer C)

To a round bottom flask equipped with a condenser, a thermometer, an argon inlet and a magnetic stirrer bar, HAdMA monomer (3.552 g, 0.016 mole), NLM monomer (5.674 g, 0.024 mole), AIBN (0.394 g, 6% of total moles of monomers), and ~30 g of THF were added. The reaction mixture was stirred at room temperature and bubbled with Ar flow for 45 minutes prior to turning on the heating mantle. The reaction was carried out at 72° C. under Ar inert atmosphere overnight. Then the reaction solution was cooled to room temperature and precipitated in DI water. The precipitated polymer was filtered and washed with DI water. The collected solid was dried by vacuum oven at 65° C. overnight.

3 g of the above obtained polymer was dissolved in 17 g of PGMEA in a round bottom flask. To the polymer solution approximately 3.7 mg of p-toluenesulfonic acid was added. After the acid was dissolved, 2.17 g of dihydropyrane was added to the solution, and the reaction was carried out at room temperature overnight. The solution became clear. The reaction was then quenched with 5 g of basic active aluminum oxide. The quenched solution was filtered through 0.2 µm filter into a glass bottle.

Example 4

Synthesis of Dihydropyrane Protected Polymer of 3-(2-hydroxyethoxy)-1-adamantyl methacrylate (Polymer D)

To a round bottom flask equipped with a condenser, a thermometer, an argon inlet and a magnetic stirrer bar, HEAdMA monomer (11.22 g, 0.04 mole), AIBN (0.459 g, 7% of total moles of monomer), and ~45 g of THF were added. The reaction mixture was stirred at room temperature and bubbled with Ar flow for 45 minutes prior to turning on the heating mantle. The reaction was carried out at 72° C. under Ar inert atmosphere overnight. Then the reaction solution was cooled to room temperature and precipitated in DI water. The precipitated polymer was filtered and washed with DI water. The collected solid was dried by vacuum oven at 65° C. overnight.

5 g of the above obtained polymer was dissolved in 18 g of THF in a round bottom flask. To the polymer solution approximately 36 mg of p-toluenesulfonic acid was added. After the acid was dissolved, 7 g of dihydropyrane was added to the solution, and the reaction was carried out at room temperature overnight. The reaction was then quenched with 2 ml of concentrated ammonium hydroxide. Then the reaction solution was precipitated in DI water with small amount of ammonium hydroxide. The precipitated polymer was filtered and washed with DI water. The collected solid was dried by vacuum oven at 50° C. overnight.

Example 5

Resist E Formulation

Polymer A was dissolved in PGMEA with 7 wt % triphenyl-sulfonium 1,1,2,2,3,3,4,4,4-nonafluoro-butane-1-sulfonate (TPSN) and 0.73 wt % of tert-butyl 2-phenyl-1,3-benzodiazole-1-carboxylate (bockbim) (all wt % are relative to the polymer) to make a solution with 4 wt % of solid content. The resulting solution was filtered through a 0.2 µm filter. The resist was spin coated on a 12" silicon wafer with 42 nm thickness coating of Dow Chemical AR40 anti-reflective layer on top of LTO (low temperature oxide) and SiCOH (low k dielectric). The resist was post-applying baked (PAB) at 100° C. for 60 seconds and exposed to 193 nm wavelength light on an ASML stepper (0.93 NA, 0.84 outer and 0.59 inner σ annular illumination). The wafer was then post-exposure baked (PEB) at 90° C. for 60 seconds. It was developed using a single puddle develop process for 30 seconds with PGMEA solvent as the developer. A 2 µm trench feature was resolved using a bright field mask.

Example 6

Resist F Formulation

Polymer B was dissolved in PGMEA with 7 wt % TPSN and 0.81 wt % of tetrabutylammonium hydroxide (TBAH) (all wt % are relative to polymer) to make a solution with 4 wt % of solid content. The resulting solution was filtered through a 0.2 µm filter. The resist was spin coated on a 12" silicon wafer with 42 nm thickness coating of Dow Chemical AR40 anti-reflective layer on top of LTO (low temperature oxide) and SiCOH (low k dielectric). The resist was post-applying baked (PAB) at 95° C. for 60 seconds and exposed to 193 nm wavelength light on an ASML stepper (0.93 NA, 0.84 outer and 0.59 inner σ annular illumination). The wafer was then post-exposure baked (PEB) at 95° C. for 60 seconds. It was developed using a single puddle develop process for 30 seconds with PGMEA solvent as the developer. A 5 µm trench feature was resolved using a bright field mask.

Example 7

Resist G Formulation

Polymer C was dissolved in PGMEA with 7 wt % TPSN and 0.81 wt % of TBAH (all wt % are relative to polymer) to make a solution with 4 wt % of solid content. The resulting solution was filtered through a 0.2 µm filter. The resist was spin coated on a 12" silicon wafer with 42 nm thickness coating of Dow Chemical AR40 anti-reflective layer on top of LTO (low temperature oxide) and SiCOH (low k dielectric). The resist was post-applying baked (PAB) at 95° C. for 60 seconds and exposed to 193 nm wavelength light on an ASML stepper (0.93 NA, 0.84 outer and 0.59 inner σ annular illumination). The wafer was then post-exposure baked (PEB) at 95° C. for 60 seconds.

It was developed using a single puddle develop process for 30 seconds with PGMEA solvent developer. No features were resolved using a bright field mask.

Example 8

Resist H Formulation

Polymer D was dissolved in PGMEA with 5 wt % TPSN and 0.5 wt % of bockbim (all wt % are relative to polymer) to make a solution with 4 wt % of solid content. The resulting solution was filtered through a 0.2 µm filter. The resist was spin coated on a 12" silicon wafer with 42 nm thickness coating of Dow Chemical AR40 anti-reflective layer on top of LTO (low temperature oxide) and SiCOH (low k dielectric). The resist was post-applying baked (PAB) at 95° C. for 60 seconds and exposed to 193 nm wavelength light on an ASML stepper (0.93 NA, 0.84 outer and 0.59 inner σ annular illumination). The wafer was then post-exposure baked (PEB) at 90° C. for 60 seconds. It was developed using a single puddle develop process for 30 seconds with 2-heptanone solvent as the developer. A 0.4 µm trench feature was resolved using a bright field mask.

Example 9

Resist I Formulation

Polymer D was dissolved in PGMEA with 5 wt % TPSN, 0.5 wt % of bockbim and 6 wt % of powderlink PL-1174 (all wt % are relative to polymer) to make a solution with 4 wt % of solid content. The resulting solution was filtered through a 0.2 µm filter. The resist was spin coated on a 12" silicon wafer with 42 nm thickness coating of Dow Chemical AR40 anti-reflective layer on top of LTO (low temperature oxide) and SiCOH (low k dielectric). The resist was post-applying baked (PAB) at 95° C. for 60 seconds and exposed to 193 nm wavelength light on an ASML stepper (0.93 NA, 0.84 outer and 0.59 inner σ annular illumination). The wafer was then post-exposure baked (PEB) at 95° C. for 60 seconds. It was developed using a single puddle develop process for 30 seconds with 2-heptanone solvent as the developer. A 3.5 µm trench feature was resolved using a bright field mask.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A photoresist composition capable of negative development comprising an imaging polymer, a crosslinking agent and a radiation sensitive acid generator, the imaging polymer comprising a monomeric unit having an acid-labile moiety-substituted hydroxyl group, wherein the monomeric unit contains an alicyclic structure.

2. The photoresist composition of claim 1, wherein the acid-labile moiety is selected from the group consisting of a tertiary alkyl carbonate, a tertiary alkyl ether, an acetal, a ketal and an orthoester.

3. The photoresist composition of claim 2, wherein the acid-labile moiety is an acetal or a ketal group.

4. The photoresist composition of claim 1, wherein the imaging polymer further comprises a second monomeric unit having a lactone group.

5. The photoresist composition of claim 1, wherein the crosslinking agent is a glycoluril compound.

6. The photoresist composition of claim 1, wherein the radiation sensitive acid generator comprises at least one of an onium salt, a succinimide derivative, a diazo compound, and a nitrobenzyl compound.

7. The photoresist composition of claim 1, further comprising at least one of a solvent, a quencher, and a surfactant.

8. The photoresist composition of claim 7, wherein the solvent comprises at least one of an ether, a glycol ether, an aromatic hydrocarbon, a ketone, and an ester.

9. The photoresist composition of claim 8, wherein the photoresist composition comprises:
   about 1 to about 30 wt. % of the imaging polymer;
   about 1 to about 30 wt. % of the crosslinking agent, based on the total weight of the imaging polymer;
   about 0.5 to about 30 wt. % of the radiation sensitive acid generator, based on the total weight of the imaging polymer; and
   about 70 to about 99 wt. % of the solvent.

10. A photoresist composition capable of negative development comprising an imaging polymer, a crosslinking agent and a radiation sensitive acid generator, the imaging polymer comprising a monomeric unit having an acid-labile moiety-substituted hydroxyl group, the imaging polymer further comprising a second monomeric unit having a lactone group.

11. The photoresist composition of claim 10, wherein the acid-labile moiety is selected from the group consisting of a tertiary alkyl carbonate, a tertiary alkyl ether, an acetal, a ketal and an orthoester.

12. The photoresist composition of claim 11, wherein the acid-labile moiety is an acetal or a ketal group.

13. The photoresist composition of claim 10, wherein the monomeric unit contains an alicyclic structure.

14. The photoresist composition of claim 10, wherein the crosslinking agent is a glycoluril compound.

15. The photoresist composition of claim 10, wherein the radiation sensitive acid generator comprises at least one of an onium salt, a succinimide derivative, a diazo compound, and a nitrobenzyl compound.

16. The photoresist composition of claim 10, further comprising at least one of a solvent, a quencher, and a surfactant.

17. The photoresist composition of claim 16, wherein the solvent comprises at least one of an ether, a glycol ether, an aromatic hydrocarbon, a ketone, and an ester.

18. The photoresist composition of claim 17, wherein the photoresist composition comprises:
- about 1 to about 30 wt. % of the imaging polymer;
- about 1 to about 30 wt. % of the crosslinking agent, based on the total weight of the imaging polymer;
- about 0.5 to about 30 wt. % of the radiation sensitive acid generator, based on the total weight of the imaging polymer; and
- about 70 to about 99 wt. % of the solvent.

* * * * *